United States Patent
Grunzweig et al.

(10) Patent No.: US 10,565,697 B2
(45) Date of Patent: Feb. 18, 2020

(54) UTILIZING OVERLAY MISREGISTRATION ERROR ESTIMATIONS IN IMAGING OVERLAY METROLOGY

(71) Applicant: KLA-Tencor Corporation, Milpitas, CA (US)

(72) Inventors: Tzahi Grunzweig, Hillsboro, OR (US); Nadav Gutman, Zichron Ya'aqov (IL); David Gready, Tel Aviv (IL); Mark Ghinovker, Yoqneam Ilit (IL); Vladimir Levinski, Migdal HaEmek (IL); Claire E. Staniunas, Forest Grove, OR (US); Nimrod Shuall, Beaverton, OR (US); Yuri Paskover, Binyamina (IL)

(73) Assignee: KLA-Tencor Corporation, Milpitas, CA (US)

( * ) Notice: Subject to any disclaimer, the term of this patent is extended or adjusted under 35 U.S.C. 154(b) by 124 days.

(21) Appl. No.: 15/739,381

(22) PCT Filed: Oct. 22, 2017

(86) PCT No.: PCT/US2017/057767
§ 371 (c)(1),
(2) Date: Dec. 22, 2017

(87) PCT Pub. No.: WO2019/078901
PCT Pub. Date: Apr. 25, 2019

(65) Prior Publication Data
US 2019/0122357 A1    Apr. 25, 2019

(51) Int. Cl.
*G06T 7/00* (2017.01)
*G03G 15/00* (2006.01)
*G06T 7/73* (2017.01)

(52) U.S. Cl.
CPC ....... *G06T 7/0004* (2013.01); *G03G 15/6561* (2013.01); *G06T 7/73* (2017.01); *G06T 2207/30148* (2013.01)

(58) Field of Classification Search
CPC .............. G06T 7/0004; G06T 7/73; G06T 2207/30148; G03G 15/6561
(Continued)

(56) References Cited

U.S. PATENT DOCUMENTS 5,485,203 A * 1/1996 Nakamura ............. H04N 9/093
                                                    348/248
7,400,430 B2 * 7/2008 Czyszczewski ......... H04N 1/58
                                                    358/504
(Continued)

FOREIGN PATENT DOCUMENTS

EP         0473363      *  3/1992 ............. H05K 13/08
WO    2015127220 A1        8/2015

OTHER PUBLICATIONS

Cleveland, et al., STL: A Seasonal-Trend Decomposition Procedure Based on Loess, Journal of Official Statistics, vol. 6, No. 1, pp. 3-73, Jan. 1, 1990.
(Continued)

*Primary Examiner* — Jerome Grant, II
(74) *Attorney, Agent, or Firm* — Hodgson Russ LLP

(57) ABSTRACT

Systems and methods are provided, which calculate overlay misregistration error estimations from analyzed measurements of each ROI (region of interest) in at least one metrology imaging target, and incorporate the calculated overlay misregistration error estimations in a corresponding estimation of overlay misregistration. Disclosed embodiments provide a graduated and weighted analysis of target quality which may be integrated in a continuous manner into the metrology measurement processes, and moreover evaluates target quality in terms of overlay misregistration, which (Continued)

forms a common basis for evaluation of errors from different sources, such as characteristics of production steps, measurement parameters and target characteristics. Such common basis then enables any of combining various error sources to give a single number associated with measurement fidelity, analyzing various errors at wafer, lot and process levels, and/or to trade-off the resulting accuracy for throughput by reducing the number of measurements, in a controlled manner.

22 Claims, 6 Drawing Sheets

(58) Field of Classification Search
USPC .......................................................... 382/151
See application file for complete search history.

(56) References Cited

U.S. PATENT DOCUMENTS

| | | | |
|---|---|---|---|
| 2005/0069220 A1* | 3/2005 | Czyszczewski | H04N 1/58 382/275 |
| 2005/0188342 A1 | 8/2005 | Goodwin | |
| 2006/0280357 A1 | 12/2006 | Seligson et al. | |
| 2014/0136137 A1* | 5/2014 | Tarshish-Shapir | G06T 7/0004 702/108 |
| 2014/0363211 A1* | 12/2014 | Sugiyama | G03G 15/5058 399/301 |
| 2016/0117847 A1 | 4/2016 | Pandev et al. | |

OTHER PUBLICATIONS

ISA/KR, International Search Report for PCT/US2017/057767 dated Jul. 19, 2018.

* cited by examiner

72

74

74B

74C

74A

UTILIZING OVERLAY MISREGISTRATION ERROR ESTIMATIONS IN IMAGING OVERLAY METROLOGY

BACKGROUND OF THE INVENTION

1. Technical Field

The present invention relates to the field of imaging overlay metrology, and more particularly, to deriving and utilizing overlay misregistration error estimations in the metrology measurements.

2. Discussion of Related Art

Imaging overlay metrology is used to estimate overlays between layers in produced integrated circuits, by measurements of imaging targets and analysis of measured images. Deficient targets are detected and removed from the analysis process in a culling procedure.

SUMMARY OF THE INVENTION

The following is a simplified summary providing an initial understanding of the invention. The summary does not necessarily identify key elements nor limits the scope of the invention, but merely serves as an introduction to the following description.

One aspect of the present invention provides a method comprising calculating overlay misregistration error estimations from analyzed measurements of each ROI (region of interest) in at least one metrology imaging target, and incorporating the calculated overlay misregistration error estimations in a corresponding overlay estimation, wherein the calculating and the incorporating are carried out by at least one computer processor.

These, additional, and/or other aspects and/or advantages of the present invention are set forth in the detailed description which follows; possibly inferable from the detailed description; and/or learnable by practice of the present invention.

BRIEF DESCRIPTION OF THE DRAWINGS

For a better understanding of embodiments of the invention and to show how the same may be carried into effect, reference will now be made, purely by way of example, to the accompanying drawings in which like numerals designate corresponding elements or sections throughout.

In the accompanying drawings.

DETAILED DESCRIPTION OF THE INVENTION

Figure 1:
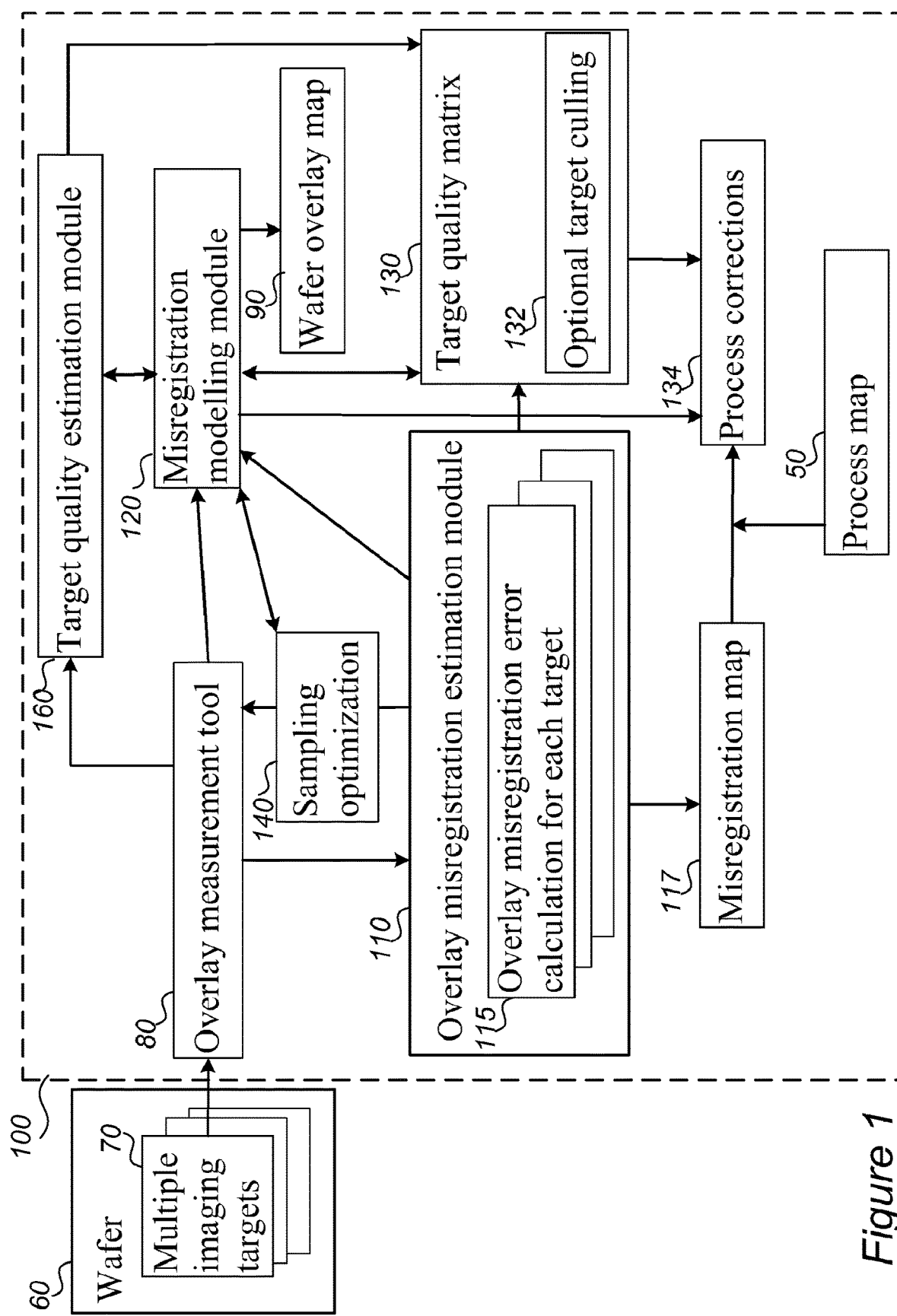
FIG. 1 is a high level schematic block diagram of an imaging overlay metrology system, according to some embodiments of the invention.

In the following description, various aspects of the present invention are described. For purposes of explanation, specific configurations and details are set forth in order to provide a thorough understanding of the present invention. However, it will also be apparent to one skilled in the art that the present invention may be practiced without the specific details presented herein. Furthermore, well known features may have been omitted or simplified in order not to obscure the present invention. With specific reference to the drawings, it is stressed that the particulars shown are by way of example and for purposes of illustrative discussion of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice.

Before at least one embodiment of the invention is explained in detail, it is to be understood that the invention is not limited in its application to the details of construction and the arrangement of the components set forth in the following description or illustrated in the drawings. The invention is applicable to other embodiments that may be practiced or carried out in various ways as well as to combinations of the disclosed embodiments. Also, it is to be understood that the phraseology and terminology employed herein are for the purpose of description and should not be regarded as limiting.

Unless specifically stated otherwise, as apparent from the following discussions, it is appreciated that throughout the specification discussions utilizing terms such as "processing", "computing", "calculating", "determining", "enhancing" or the like, refer to the action and/or processes of a computer or computing system, or similar electronic computing device, that manipulates and/or transforms data represented as physical, such as electronic, quantities within the computing system's registers and/or memories into other data similarly represented as physical quantities within the computing system's memories, registers or other such information storage, transmission or display devices.

Systems and methods are provided, which calculate overlay misregistration error estimations from analyzed measurements of each ROI (region of interest) in at least one metrology imaging target, and incorporate the calculated overlay misregistration error estimations in a corresponding estimation of overlay misregistration. Disclosed embodiments provide a graduated and weighted analysis of target quality which may be integrated in a continuous manner into the metrology measurement processes, and moreover evaluates target quality in terms of overlay misregistration, which forms a common basis for evaluation of errors from different sources, such as characteristics of production steps, measurement parameters and target characteristics. Such common basis then enables any of combining various error sources to give a single number associated with measurement fidelity, analyzing various errors at wafer, lot and process levels, and/or to trade-off the resulting accuracy for throughput by reducing the number of measurements, in a controlled manner.

Disclosed systems and methods may be configured to provide continuous quantitative (not binary) assessments of a quality the measurements of imaging targets, in terms of overlay misregistration, which express different types of errors on a common basis and enable sensitive weighting of the measurements and the targets in the derivation of the overlay. Moreover, disclosed systems and methods may be configured to provide additional information concerning the production and the measurement processes, which may be used to improve and correct detected deficiencies. Disclosed systems and methods may be configured to calculate the individual errors associated with each of its measurements and optionally use modelling software to model the overlay e.g., using the measurement values as input and weight the measurement significance in the final model using the associated errors. Certain embodiments provide and/or utilize overlay misregistration error estimations in addition to overlay misregistration (also termed overlay error or misregistration error) measured by prior art overlay tools. Target quality may be estimated alongside the overlay misregistration of the target, and the estimated target quality may be used in the modeling and subsequently in the process correction.

FIG. 1 is a high level schematic block diagram of an imaging overlay metrology system 100, according to some embodiments of the invention. Imaging overlay metrology system 100 comprises an overlay measurement tool 80 configured to measure a plurality of ROIs from each of a plurality of metrology imaging targets 70 on a wafer 60, and an overlay misregistration error estimation module 110 configured to calculate overlay misregistration error estimations 115, from different components in analyzed measurements of the ROIs. Imaging overlay metrology system 100 is configured to incorporate calculated overlay misregistration error estimations 115 in a corresponding overlay estimation, as explained below, and may be implemented using computer processor(s) (not shown, possibly part of any of tool 100 and modules 110, 120). Additional elements illustrated schematically in FIG. 1 are presented in detail below.

Image analysis may be used to derive overlay misregistration error estimations (e.g., error bars) associated with the measurements for each target, and having physical units (e.g., overlay units)—which may be processed to form a single overlay misregistration error estimation for each measurement. A target quality estimation module 160 may be configured to receive data and/or measurements from overlay measurement tool 80 and derive and deliver target quality estimations to misregistration modelling module 120 and/or possibly as additional input into a target quality matrix 130, as described below. Target quality matrix 130 may be configured to associate each target with a set of quantities that represent the targets' overlay misregistration error estimation 115.

Certain embodiments provide and/or utilize overlay misregistration error estimations in addition to overlay misregistration (also termed overlay error or misregistration error) measured by prior art overlay tools. In certain embodiments, any of misregistration map 117, wafer overlay map 90 and process map 50 may be enhanced and/or improved by misregistration modelling module 120 and/or by target quality estimation module 160 using overlay misregistration error estimations 115 from overlay misregistration error estimation module 110. The examples provided below are non-limiting embodiments of this approach. Further explanation of FIG. 1 is provided below.

Figure 2A:
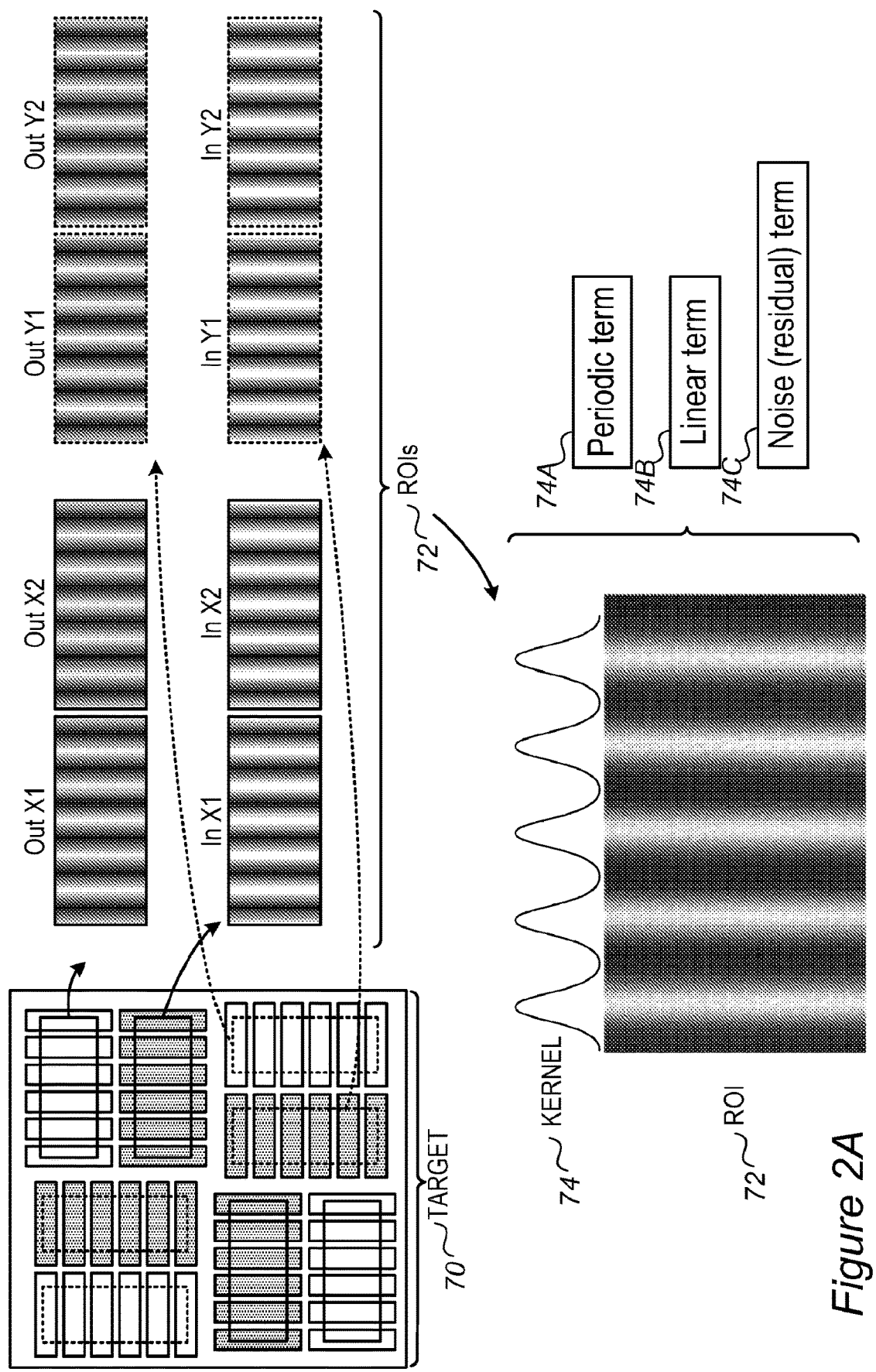
FIGS. 2A-2D are high level schematic illustrations of measurements of imaging target and kernel signal components, according to some embodiments of the invention.
Figure 2B:
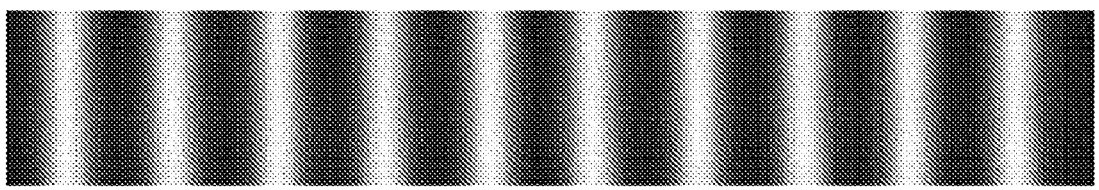
Figure 2B:
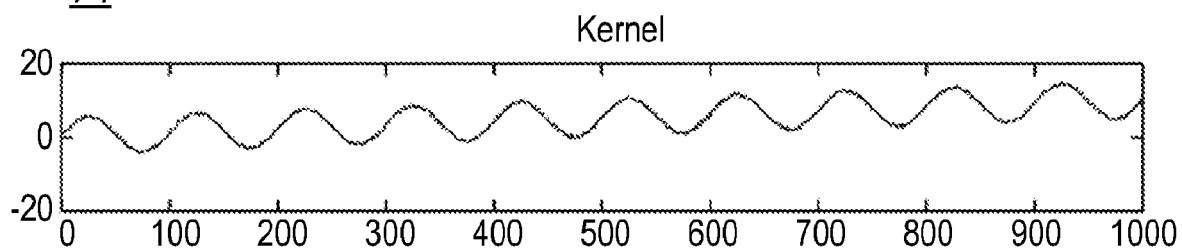
Figure 2B:
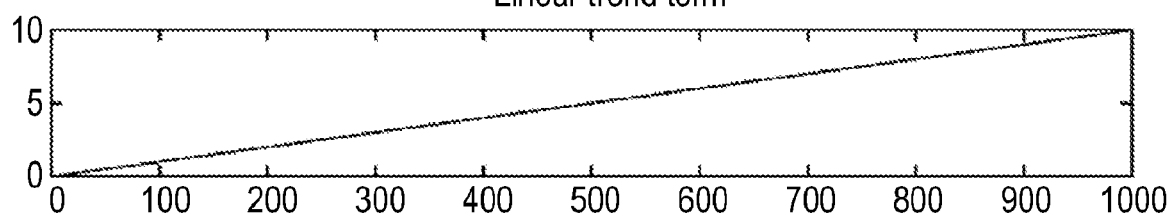
Figure 2B:
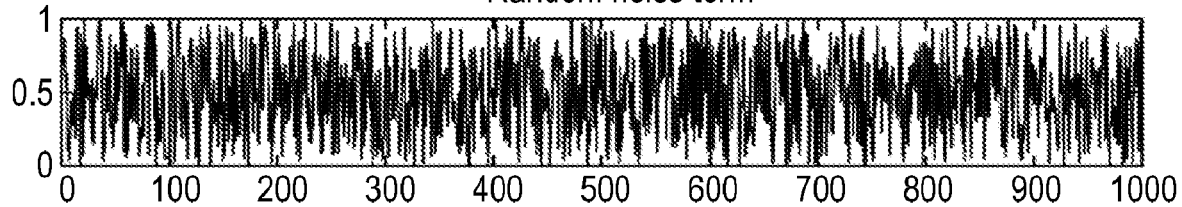
Figure 2B:
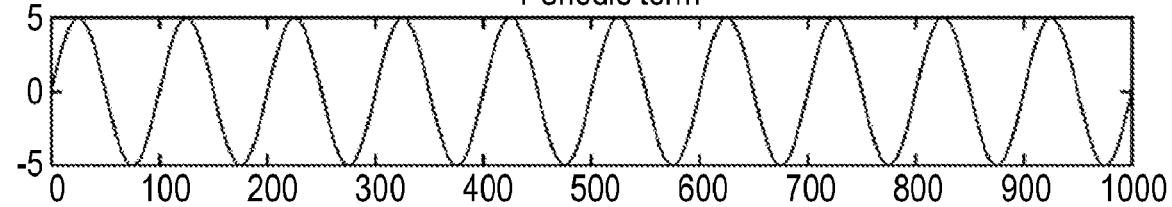
Figure 2D:
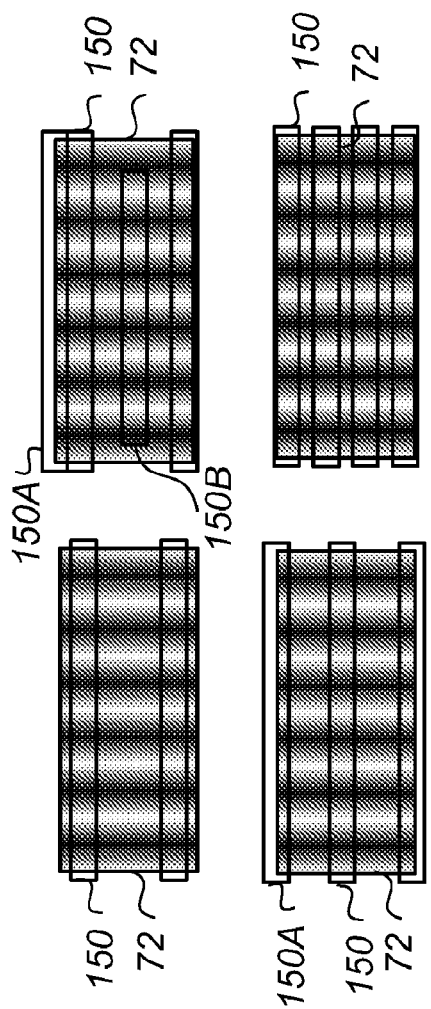
Figure 2C:
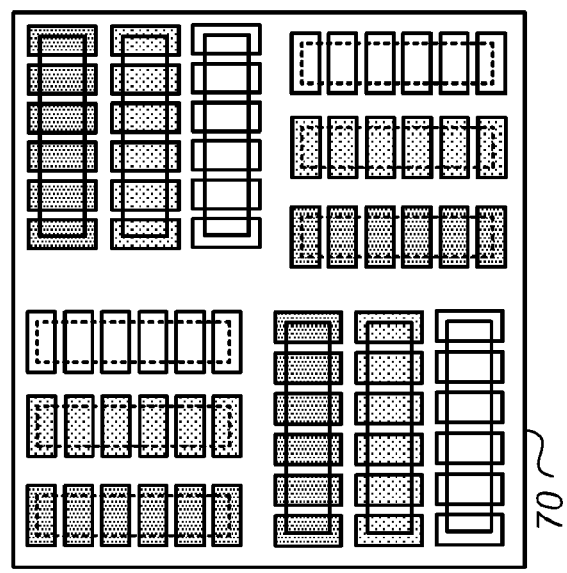

FIGS. 2A-2D are high level schematic illustrations of measurements of imaging target 70 and kernel signal components, according to some embodiments of the invention. Imaging target 70 is illustrated in FIG. 2A in a non-limiting manner as a two-layer AIM (advanced imaging metrology) target. Similar measurements and analysis may be applied on any imaging target 70 composed of periodic structures. For example, FIG. 2C is a high level schematic illustration of a three-layer AIM target 70, according to some embodiments of the invention. Target 170 may comprise any imaging target 70 with periodic structures, e.g., AIM (FIG. 2A), triple AIM (FIG. 2C), XY separate AIM, and BIB (box in box), as well as equivalent metrology imaging targets.

ROIs 72 are indicated schematically in FIG. 2A as parts of corresponding periodic structures and denoted schematically with respect to measurement direction (x/y), index number in the target (1/2) and layer (in/out, equivalent to position in target 70). A kernel 74 may be derived from each ROI 72, which indicates an intensity profile along ROI 72 (the intensity profile may be derived in different ways from ROI 72). Kernel 74 may be analyzed as being composed of multiple components, e.g., a periodic term 74A, a linear term 74B, and a noise, or residual, term 74C. ROI 72, kernel 74 and components 74A, 74B, 74C are exemplified in FIG. 2B in a non-limiting empiric example.

For example, in the illustrated non-limiting example, the intensity profile of kernel 74 may represent an intensity pattern of a periodic bar-trench sequence. ROI 72 may be averaged over the direction perpendicular to the measurement (periodicity) direction, or may be separated into different sub-regions along the perpendicular direction (see FIG. 2D and below). The sum of components 74A, 74B, 74C may equal kernel 74, and components 74A, 74B, 74C may be derived by various analytic methods. For example, kernel 74 (denoted $\kappa(x)$) may be expressed as a cosine series (Equations 1, with the overlay misregistration denoted by OVL (overlay) being calculated from weighted coefficients by weights denoted $w_i$) with components 74B, 74A, 74C corresponding to coefficients $A_1$, $A_2$ and $\Sigma A_3 \ldots A_n$, respectively. Alternatively or complementarily, kernel 74 may be analyzed using polynomial or other expansions, with corresponding modifications in the definitions of the kernel components.

$$\kappa(x) = \frac{A_0}{2} + \sum_{n=1}^{N} A_n \cos\left(\frac{2\pi n x}{P} + \phi_n\right) \qquad \text{Equations 1}$$

$$OVL = AVG_{W_n}(\Delta_n) \text{ with}$$

$$W_n \equiv n^2 A_n^L A_n^R, \Delta_n \equiv \frac{P}{2\pi n}(\varphi_n^R + \varphi_n^L)$$

The overlay misregistration error estimation may be derived from one or more of 74A, 74B, 74C, e.g., from linear term 74B and noise term 74C, in a non-limiting example. For example, the overlay misregistration error estimation may be derived from a difference between an overlay calculated using kernels 74 and an overlay calculated using only periodic components 74A of respective kernels 74. Using the following definitions, the overlay misregistration error estimations may be derived as follows. OVL_{kernel} denotes the overlay as calculated from the ROI; OVL_{only periodic term} denotes the overlay as calculated from the ROI after removing linear terms and noise terms; OVL_{periodic term AND linear term} denotes the overlay as calculated form the ROI after removing only the noise term; and OVL_{periodic term AND noise term} denotes the overlay as calculated from the ROI after removing only the linear term. The overlay misregistration error estimations associated with the various terms may be calculated as: dE_{noise}=OVL_{kernel}−OVL_{periodic term AND linear term}; dE_{linear}=OVL_{kernel}−OVL_{periodic term AND noise term}; and dE_{non periodicity}=OVL_{kernel}−OVL_{only periodic term}.

Any number of ROIs 72 may be derived from the periodic structures in target 70 and multiple overlays may be calculated from measurement data analyzed with respect to ROIs

72. FIG. 2D is a high level schematic illustration of various selections of sub-regions 150 in ROIs 72, according to some embodiments of the invention. ROIs 72 are illustrated schematically, and may be derived from any of the periodic structures in targets 70.

In certain embodiments, overlay misregistration error estimation module 110 may be further configured to calculate the overlay misregistration error estimations with respect to multiple sub-regions 150 of each ROI 72 and to calculate an additional overlay misregistration error estimation from the multiple calculated overlay misregistration error estimations for sub-regions 150 of each ROI 72. For example, the additional overlay misregistration error estimation may comprise a variance among calculated overlay misregistration error estimations for different sub-regions 150 of the same ROI 72. In certain embodiments, the additional overlay misregistration error estimation may be calculated from calculated overlay misregistration error estimations for corresponding sub-regions 150 of different ROIs 72. Sub-regions 150 may be selected in a variety of ways, some of which are exemplified in a non-limiting manner in FIG. 2D. Any number of sub-regions 150 may be selected in each ROI 72 (e.g., 1, 2, 3, 4, 5, etc.), not necessarily the same number in each ROI 72 (e.g., ROIs 72 may be prioritized according to the required degree of sub-sampling). Sub-regions 150 may be selected at a central, or internal region of ROI 72, or possibly along an edge of ROI 72 (see e.g., sub region 150A), at least for one or more ROI 72. Sub-regions 150 may be selected along the full length of ROI 72, or possibly along a partial length of ROI 72 (see e.g., sub region 150B), at least for one or more ROI 72.

For example, the overlay misregistration error estimation may be used to estimate target consistency by estimating a degree of variability within ROI 72, which may be used to indicate a level of systematic noise in the target's periodic structure, e.g., low quality or deficient processing of elements of the periodic structure. Statistical analysis of measurement data and/or estimated errors in sub-regions 150 of ROI 72 may be used to characterize various error sources. Moreover, overlays among sub-regions 150 may be calculated, e.g., using algorithms for overlay extraction from the ROIs, to provide N sub-overlays for N sub-ROI's (sub-regions 150) and their standard deviation (or sigma) may be used as the overlay misregistration error estimation ("kernel noise"). In certain embodiments, the overlay may be calculated using part of the information in the ROI's, according to the principles disclosed above and concerning the decomposition of the Kernel to periodic, linear trend and noise. Other specific decomposition possibilities may comprise any of the following non-limiting examples: Fourier decomposition to different spatial frequencies, or spatial decomposition to different sub-divisions of the ROIs—etc. Then OVL may be calculated using the partial data and an error estimate be made by comparing the ovl calculated by partial data to the ovl calculated by other partial data, or all the ROI data. This would give error estimate: dE_{partial kernel}=OVL_{kernel}−OVL_{partial kernel}. If a set of such differences exist, they can be represented collectively, for example by variance and mean.

In certain embodiments, overlay misregistration error estimation module 110 may be further configured to calculate a contrast error estimation in terms of misregistration overlay and incorporate the calculated contrast error in the corresponding overlay estimation. Due to the finite signal to noise ratio of a sensing device and the finite signal obtained from finite quantity of radiation that is scattered off the target—the contrast is related to the precision of the measurement. While the contrast can be improved by collecting more light, practical considerations limit the measurement time and hence a precision penalty exists, which may be expressed in units of overlay (denoted $dE_{contrast}$) and added to error calculation 115. As all error estimations dE 115 are expressed in terms of overlay misregistration, they may be used to derive a single cumulative error estimation 115 (denoted E) to characterize the quality of any particular measurement and/or set of measurements, e.g., using $E=\sqrt{(w_{periodic} \cdot dE_{periodic} + w_{pk} \cdot dE_{pk} + w_{contrast} \cdot dE_{contrast})}$ with $w_{periodic}$, $w_{pk}$, $w_{contrast}$ being optional corresponding weights for the periodic, partial kernel and contrast respective estimations, e.g., normalized weights assigned to the corresponding errors dE. The cumulative error may be used for different purposes as explained below, e.g., to calculate weights for each measurement result within an analysis process of multiple target measurements. Similar considerations may be applied to combine different measurements error estimations that are measured in the same measurement conditions but result from different analysis. Several error measurements may be derived from different measurement conditions, with a single analysis method, such as, in a non-limiting example, measurements through different color filters, e.g., to quantify the total target error for use with a specific filter from the measurement error conducted by using the same filter, or by using all known filters or some combination of all known filters It is noted that using overlay misregistration error estimations 115 enables to associate estimations relating to different ROIs, e.g., derive overlay misregistration error estimations 115 by weighting estimations relating to different ROIs. Advantageously, combining multiple misregistration error contributions from different ROIs may enhance the accuracy of the overlay misregistration error estimations and of target quality estimation.

Any of disclosed calculated errors 115 (e.g., including one or more of the components listed above and/or any cumulative errors that may be derived from them) may be used to derive a misregistration map 117 which relates the respective calculated errors with the coordinates of wafer 60 and/or target quality matrix 130 which relates the respective calculated errors with targets 70 (clearly, target quality matrix 130 may be derived from misregistration map 117). Target quality matrix 130 and/or misregistration map 117 may be used to derive more information with respect to production steps and processes, as disclosed below. Target quality matrix 130 may be configured to associate each target with a set of quantities that represent the targets' overlay misregistration error estimation 115.

It is further noted that any of disclosed calculated errors 115 may be calculated in different ways to interrelate and/or express various aspects of the measurement in terms of misregistration overlay. Corresponding flags may be derived from any of disclosed calculated errors 115 and used in the operation of imaging overlay metrology system 100.

In certain embodiments, target quality matrix 130 may be used to select targets (target culling 132) and/or to weight targets (as disclosed above) for deriving a more accurate and/or more reliable overlay estimation. In certain embodiments, imaging overlay metrology system 100 may further comprise misregistration modelling module 120 configured to modify target selection by overlay measurement tool 80 according to target quality matrix 130 to optimize target sampling 140 with respect to accuracy and/or measurement time.

In certain embodiments, misregistration modelling module 120 may be further configured to incorporate target quality matrix 130 received from overlay misregistration error estimation module 110 and based on calculated overlay misregistration error estimations 115—into a wafer overlay map 90 derived by overlay measurement tool 80.

In certain embodiments, overlay misregistration error estimation module 110 may be further configured to derive misregistration map 117 from calculated overlay misregistration error estimations 115, and imaging overlay metrology system 100 may be further configured to relate misregistration map 117 with a process map 50 to identify process errors and suggest process corrections 134, e.g., by misregistration modelling module 120. Alternatively or complementarily, imaging overlay metrology system 100 may be configured to derive or suggest process corrections 134 based on target quality matrix 130.

Certain embodiments provide and/or utilize overlay misregistration error estimations in addition to overlay misregistration (also termed overlay error or misregistration error, basically a shift in positioning of components of a target, associated with two or more layers of the process) measured by prior art overlay tools. In certain embodiments, any of misregistration map 117, wafer overlay map 90 and process map 50 may be enhanced and/or improved by misregistration modelling module 120 and/or by target quality estimation module 160 using overlay misregistration error estimations 115 from overlay misregistration error estimation module 110. Target quality estimation module 160 to add another level of process control by analyzing overlay misregistration error estimations, which are not handled in the prior art.

The distribution of overlay misregistration errors 115 on wafer 60, as provided e.g., in misregistration map 117, may be used in additional ways, for example for zonal analysis within-wafer modeling, where distinct areas have characteristic error behavior that is distinguished from the wafer behavior as a whole. Any of calculated overlay misregistration errors 115 and/or parts of misregistration map 117 may be used to quantify and characterize wafer zones and/or whole wafers.

In certain embodiments, the distribution of overlay misregistration errors 115 may be analyzed with respect to one or more lots of wafer 60, and possibly also with respect to the production process as whole and/or with respect to multiple layers of wafers 60, as provided e.g., in misregistration map 117. Such analysis may be used to derive (e.g., by target quality estimation module 160 and/or by a specific module) fab process control information beyond the wafer level.

In certain embodiments, calculated overlay misregistration error estimations 115 may be used to aggregate multiple wafers 60 based on the distribution of flag values related to calculated overlay misregistration error estimations 115. For example, wafer level misregistration map 117 may be used as a signature of a fault in a specific process or collection of processes, and used to derive process corrections 134. Misregistration map 117 may thus be used to provide an essential connection to process steps or features, used to improve and correct the production process, possibly independently of other metrology measurements (e.g., overlay).

In certain embodiments, calculated overlay misregistration error estimations 115 may be used to provide feed-forward sampling optimization, e.g., as part of sampling optimization 140. Misregistration map 117 may be used by imaging overlay metrology system 100 to identify area(s) on wafer 60 which have typically higher error values and modify target sampling measurement procedures and/or data analysis algorithms to accommodate for the higher error values. For example, accommodations of imaging overlay metrology system 100 may be by increasing sampling densities in one or more layers, using more targets 70 and/or specific, more reliable targets 70 as identified above, change measurement conditions (e.g., enhance contra), using more sub-regions 150, selecting specific sub-regions 150 of ROIs 72 etc.

While overlay misregistration error estimation module 110 and/or misregistration modelling module 120 may be configured to operate in realtime, during operation of imaging overlay metrology system 100, in certain embodiments, overlay misregistration error estimation module 110 and/or misregistration modelling module 120 may also be operated offline, using obtained measurement images—allowing for flexibility and expansion of the disclosed analysis as needed during e.g., troubleshooting or development stages.

In certain embodiments, disclosed imaging overlay metrology systems 100 may be further configured to combine calculated overlay misregistration error estimations 115 into at least one measurement fidelity indicator, applicable in any of the process stages and production levels.

Advantageously, incorporating overlay misregistration error estimations 115, calculated in terms of misregistration overlay, into the analysis of the metrology measurement results—enables increasing the accuracy and reliability of the results, as less accurately produced targets (e.g., marginal targets of the wafer) may be given smaller weight than more accurately produced targets. In certain embodiments, using overlay misregistration error estimations 115 may also enable to conduct a controlled trade-off between accuracy by throughput as needed, with clear indication and control of the amount of accuracy reduction in the trade-off.

In certain embodiments, disclosed imaging overlay metrology systems 100 may be further configured to provide and control a trade-off between accuracy and throughput, based on calculated overlay misregistration error estimations 115.

Elements disclosed above may be combined in any operable combination, and the illustration of certain elements in certain figures and not in others merely serves an explanatory purpose and is non-limiting.

Figure 3:
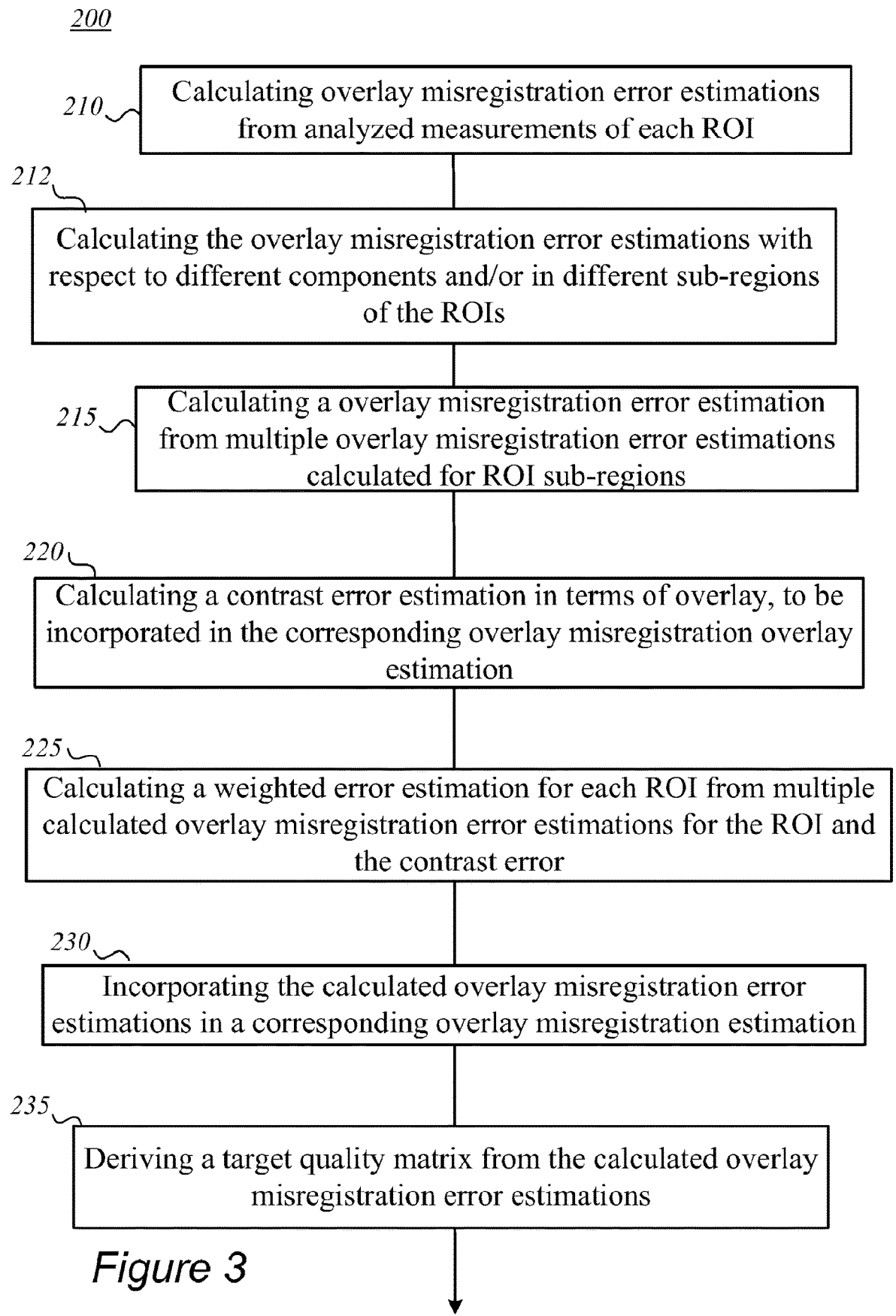
FIG. 3 is a high-level flowchart illustrating a method, according to some embodiments of the invention.
Figure 3:
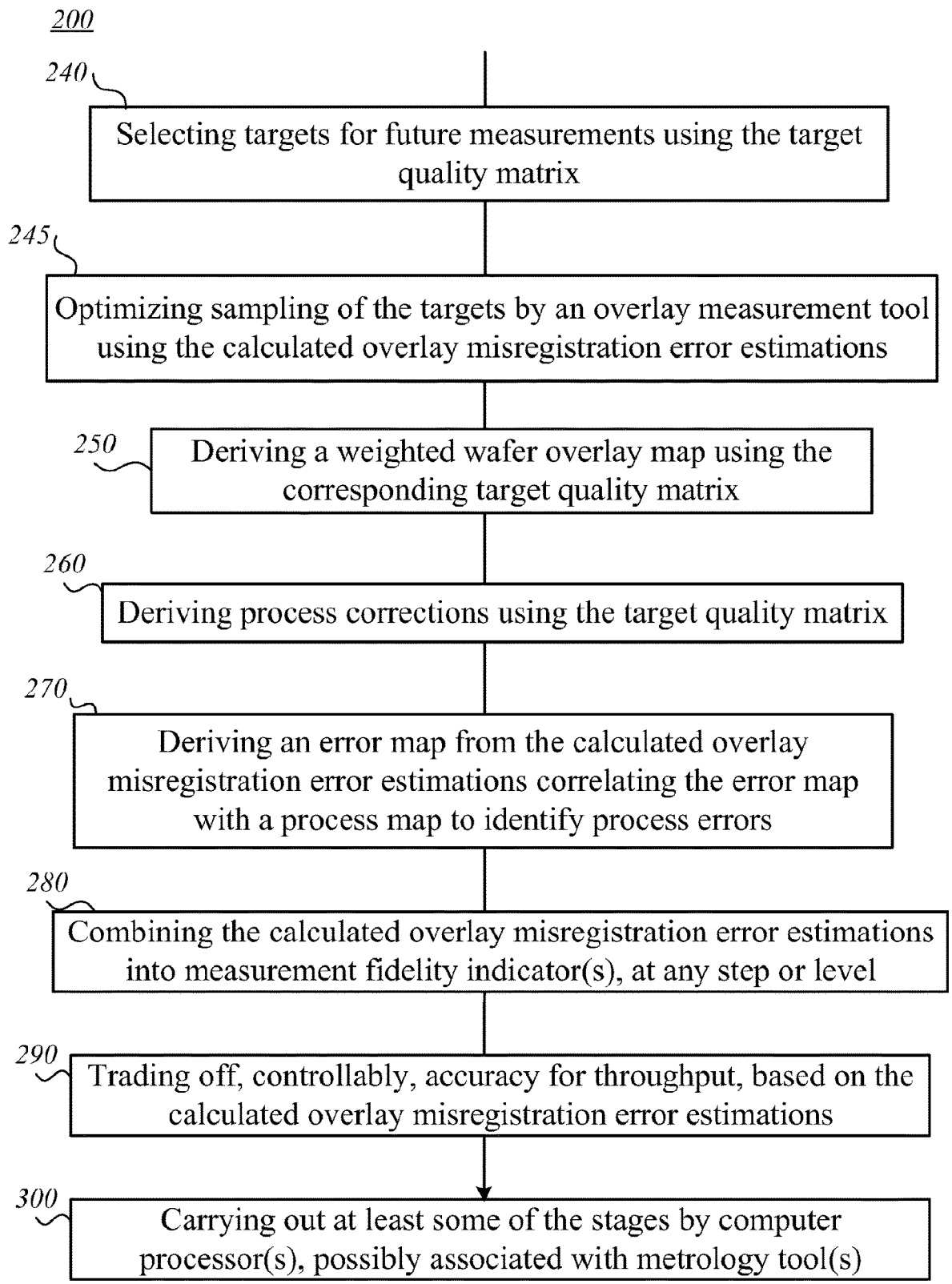

FIG. 3 is a high-level flowchart illustrating a method 200, according to some embodiments of the invention. The method stages may be carried out with respect to imaging overlay metrology system 100 described above, which may optionally be configured to implement method 200. Method 200 may be at least partially implemented by at least one computer processor, e.g., in a metrology module. Certain embodiments comprise computer program products comprising a computer readable storage medium having computer readable program embodied therewith and configured to carry out the relevant stages of method 200. Certain embodiments comprise metrology modules comprising the computer program products implementing stages of method 200. Method 200 may comprise the following stages, irrespective of their order.

Method 200 may comprise calculating overlay misregistration error estimations from analyzed measurements of each ROI in at least one metrology imaging target (stage 210), and incorporating the calculated overlay misregistration error estimations in a corresponding overlay estimation (stage 230), wherein calculating 210, incorporating 230 and possibly other of the stages listed below, are carried out by at least one computer processor (stage 300).

In certain embodiments, the overlay misregistration error estimations may be calculated with respect to different components of ROI signals, e.g., linear, periodic and/or noise (residual) components; in certain embodiments, the overlay misregistration error estimations may be calculated with respect to multiple sub-regions of each ROI; and in certain embodiments, the overlay misregistration error estimations may be calculated with respect to combinations of multiple components of ROI signals and multiple sub-regions of the ROIs (stage 212). Method 200 may further comprise calculating an additional overlay misregistration error estimation from the multiple calculated overlay misregistration error estimations for the sub-regions of each ROI (stage 215).

Method 200 may further comprise calculating a contrast error estimation in terms of overlay misregistration and incorporating the calculated contrast error in the corresponding overlay misregistration error estimation (stage 220) and possibly calculating a weighted error estimation for each ROI from multiple calculated overlay misregistration error estimations for the ROI and the contrast error (stage 225).

Method 200 may further comprise deriving a target quality matrix from the calculated overlay misregistration error estimations of a plurality of metrology imaging targets (stage 235) and selecting targets for future measurements using values from the target quality matrix (stage 240). In certain embodiments, method 200 may comprise optimizing the sampling of a plurality of metrology imaging targets by an overlay measurement tool using the calculated overlay misregistration error estimations of the plurality of targets (stage 245). In certain embodiments, method 200 may comprise weighting a corresponding wafer overlay map (e.g., by deriving a weighted wafer overlay matrix) using values from the target quality matrix (stage 250). In certain embodiments, method 200 may comprise deriving process corrections from the target quality matrix (stage 260).

Method 200 may comprise deriving an error map from the calculated overlay misregistration error estimations of a plurality of metrology imaging targets and correlating the error map with a process map to identify process errors (stage 270), possibly to derive process corrections therefrom.

Method 200 may further comprise combining the calculated overlay misregistration error estimations into at least one measurement fidelity indicator (stage 280), at any system level and/or process step.

Method 200 may further comprise trading off, controllably, accuracy for throughput, based on the calculated overlay misregistration error estimations (stage 290).

Advantageously with respect to the prior art, disclosed systems 100 and methods 200 provide full consideration of individual target qualities in providing overlay and other metrology measurements. While current practice mere applies target culling to avoid consideration of the most extremely aberrant targets, and is therefore limited in scope and binary in nature, disclosed embodiments provide a graduated and weighted analysis of target quality which may be integrated in a continuous manner into the metrology measurement processes, and moreover evaluates target quality in terms of overlay misregistration, which forms a common basis for evaluation of errors from different sources, as explained above. Moreover, disclosed embodiments enable error evaluation to be propagated among wafers when relevant and allow to identify process deficiencies independently or as enhancement of other metrology measurements. The disclosed error analysis further enables discrimination among various sources of errors, relating to production steps, measurement parameters and target characteristics and enable separating them according to the errors they cause, which provides an additional level of information between mere target culling.

Aspects of the present invention are described above with reference to flowchart illustrations and/or portion diagrams of methods, apparatus (systems) and computer program products according to embodiments of the invention. It will be understood that each portion of the flowchart illustrations and/or portion diagrams, and combinations of portions in the flowchart illustrations and/or portion diagrams, can be implemented by computer program instructions. These computer program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or portion diagram or portions thereof.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or portion diagram or portions thereof.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or portion diagram or portions thereof.

The aforementioned flowchart and diagrams illustrate the architecture, functionality, and operation of possible implementations of systems, methods and computer program products according to various embodiments of the present invention. In this regard, each portion in the flowchart or portion diagrams may represent a module, segment, or portion of code, which comprises one or more executable instructions for implementing the specified logical function(s). It should also be noted that, in some alternative implementations, the functions noted in the portion may occur out of the order noted in the figures. For example, two portions shown in succession may, in fact, be executed substantially concurrently, or the portions may sometimes be executed in the reverse order, depending upon the functionality involved. It will also be noted that each portion of the portion diagrams and/or flowchart illustration, and combinations of portions in the portion diagrams and/or flowchart illustration, can be implemented by special purpose hardware-based systems that perform the specified functions or acts, or combinations of special purpose hardware and computer instructions.

In the above description, an embodiment is an example or implementation of the invention. The various appearances of "one embodiment", "an embodiment", "certain embodiments" or "some embodiments" do not necessarily all refer to the same embodiments. Although various features of the invention may be described in the context of a single embodiment, the features may also be provided separately or in any suitable combination. Conversely, although the invention may be described herein in the context of separate embodiments for clarity, the invention may also be implemented in a single embodiment. Certain embodiments of the invention may include features from different embodiments disclosed above, and certain embodiments may incorporate elements from other embodiments disclosed above. The disclosure of elements of the invention in the context of a specific embodiment is not to be taken as limiting their use in the specific embodiment alone. Furthermore, it is to be understood that the invention can be carried out or practiced in various ways and that the invention can be implemented in certain embodiments other than the ones outlined in the description above.

The invention is not limited to those diagrams or to the corresponding descriptions. For example, flow need not move through each illustrated box or state, or in exactly the same order as illustrated and described. Meanings of technical and scientific terms used herein are to be commonly understood as by one of ordinary skill in the art to which the invention belongs, unless otherwise defined. While the invention has been described with respect to a limited number of embodiments, these should not be construed as limitations on the scope of the invention, but rather as exemplifications of some of the preferred embodiments. Other possible variations, modifications, and applications are also within the scope of the invention. Accordingly, the scope of the invention should not be limited by what has thus far been described, but by the appended claims and their legal equivalents.

What is claimed is:

1. A method comprising:
   calculating overlay misregistration error estimations from analyzed measurements of each region of interest (ROI) in at least one metrology imaging target,
   deriving a target quality matrix, wherein the deriving includes at least one of:
     deriving the target quality matrix from the calculated overlay misregistration error estimations of a plurality of metrology imaging targets and selecting targets for future measurements using values from the target quality matrix,
     deriving the target quality matrix from the calculated overlay misregistration error estimations of a plurality of metrology imaging targets and weighting a corresponding wafer overlay map using values from the target quality matrix, or
     deriving the target quality matrix from the calculated overlay misregistration error estimations of a plurality of metrology imaging targets and deriving process corrections from the target quality matrix, and
   incorporating the calculated overlay misregistration error estimations in a corresponding estimation of overlay misregistration,
   wherein the calculating, the deriving, and the incorporating are carried out by at least one computer processor.

2. The method of claim 1, wherein the overlay misregistration error estimations are calculated with respect to different components of ROI signals.

3. The method of claim 1, wherein the overlay misregistration error estimations are calculated with respect to multiple sub-regions of each ROI.

4. The method of claim 3, further comprising calculating an additional overlay misregistration error estimation from the calculated overlay misregistration error estimations for the sub-regions of each ROI.

5. The method of claim 1, further comprising calculating a contrast error estimation in terms of overlay misregistration and incorporating the calculated contrast error in the corresponding estimation of overlay misregistration.

6. The method of claim 5, further comprising calculating a weighted overlay misregistration error estimation for each ROI from the calculated overlay misregistration error estimations for the ROI and the contrast error.

7. The method of claim 1, wherein the deriving includes deriving the target quality matrix from the calculated overlay misregistration error estimations of the plurality of metrology imaging targets and selecting the targets for future measurements using the values from the target quality matrix.

8. The method of claim 1, wherein the deriving includes deriving the target quality matrix from the calculated overlay misregistration error estimations of the plurality of metrology imaging targets and weighting the corresponding wafer overlay map using values from the target quality matrix.

9. The method of claim 1, wherein the deriving includes deriving the target quality matrix from the calculated overlay misregistration error estimations of the plurality of metrology imaging targets and deriving the process corrections from the target quality matrix.

10. The method of claim 1, further comprising deriving a misregistration map from the calculated overlay misregistration error estimations of a plurality of metrology imaging targets and correlating the misregistration map with a process map to identify process errors.

11. The method of claim 1, further comprising optimizing sampling of a plurality of metrology imaging targets by an overlay measurement tool using the calculated overlay misregistration error estimations of the plurality of targets.

12. The method of claim 1, further comprising combining the calculated overlay misregistration error estimations into at least one measurement fidelity indicator.

13. The method of claim 1, further comprising trading off, controllably, accuracy for throughput, based on the calculated overlay misregistration error estimations.

14. A computer program product comprising a non-transitory computer readable storage medium having computer readable program embodied therewith, the computer readable program configured to carry out the method of claim 1.

15. A metrology module comprising the computer program product of claim 14.

16. An imaging overlay metrology system comprising:
   an overlay measurement tool configured to measure a plurality of regions of interest (ROIs) from each of a plurality of metrology imaging targets on a wafer, and
   an overlay misregistration estimation module configured to calculate overlay misregistration error estimations from different components in analyzed measurements of the ROIs, and
   a misregistration modelling module configured to incorporate a target quality matrix received from the overlay misregistration estimation module and based on the calculated overlay misregistration error estimations into a wafer overlay map of the overlay measurement tool
   wherein the imaging overlay metrology system is configured to incorporate the calculated overlay misregistration error estimations in a corresponding estimation of overlay misregistration.

17. The imaging overlay metrology system of claim 16, wherein the overlay misregistration estimation module is further configured to calculate the overlay misregistration error estimations with respect to multiple sub-regions of each ROI and to calculate an additional overlay misregistration error estimation from the calculated overlay misregistration error estimations for the sub-regions of each ROI.

18. The imaging overlay metrology system of claim 16, wherein the overlay misregistration estimation module is further configured to calculate a contrast error estimation in terms of overlay and incorporate the calculated contrast error in the corresponding estimation of overlay misregistration.

19. The imaging overlay metrology system of claim 16, wherein the misregistration modelling module is further configured to modify target selection by the overlay measurement tool according to the target quality matrix to optimize target sampling with respect to accuracy and/or measurement time.

20. The imaging overlay metrology system of claim 16, wherein the overlay misregistration estimation module is further configured to derive a misregistration map from the calculated overlay misregistration error estimations, and wherein the imaging overlay metrology system is further configured to relate the misregistration map with a process map to identify process errors.

21. The imaging overlay metrology system of claim 16, further configured to combine the calculated overlay misregistration error estimations into at least one measurement fidelity indicator.

22. The imaging overlay metrology system of claim 16, further configured to provide and control a trade-off between accuracy and throughput, based on the calculated overlay misregistration error estimations.

\* \* \* \* \*